(12) United States Patent
Yamada et al.

(10) Patent No.: US 7,804,700 B2
(45) Date of Patent: Sep. 28, 2010

(54) SEMICONDUCTOR MEMORY DEVICE WITH REDUCED COUPLING NOISE

(75) Inventors: Yasutoshi Yamada, Kodaira (JP);
Tomonori Sekiguchi, Tama (JP);
Riichiro Takemura, Los Angeles, CA (US); Kazuhiko Kajigaya, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 36 days.

(21) Appl. No.: 12/343,086

(22) Filed: Dec. 23, 2008

(65) Prior Publication Data

US 2009/0175064 A1    Jul. 9, 2009

(30) Foreign Application Priority Data

Dec. 25, 2007    (JP) .............................. 2007-331571

(51) Int. Cl.
*G11C 5/06* (2006.01)
*G11C 11/34* (2006.01)
*G11C 7/00* (2006.01)

(52) U.S. Cl. ........................... 365/69; 365/72; 365/174; 365/63; 365/206

(58) Field of Classification Search ................. None
See application file for complete search history.

(56) References Cited

U.S. PATENT DOCUMENTS

| 5,097,441 A | * | 3/1992 | Cho et al. ..................... 365/51 |
| 5,155,700 A | * | 10/1992 | Min et al. ..................... 365/63 |
| 5,463,576 A | * | 10/1995 | Kuriyama et al. ............. 365/51 |

FOREIGN PATENT DOCUMENTS

| JP | 6-268173 A | 9/1994 |
| JP | 2001-167572 A | 6/2001 |

* cited by examiner

*Primary Examiner*—Hoai V Ho
*Assistant Examiner*—James G Norman
(74) *Attorney, Agent, or Firm*—Sughrue Mion, PLLC

(57) ABSTRACT

A semiconductor device includes a plurality of word lines, a plurality of bit lines, a plurality of memory cells provided at the intersections of the plurality of word lines and the plurality of bit lines and each of that includes a MIS transistor and a memory element, a decoder circuit for selecting a plurality of word lines, and a sense-amplifier circuit for determining information that is read from any of the plurality of memory cells to any of the plurality of bit lines, wherein a twist connector for switching the wiring order of the plurality of word lines is provided and level-stabilizing circuits, for supplying the potential level of a non-selected state to the plurality of word lines in the non-selected state are arranged in the area below the twist connector.

13 Claims, 15 Drawing Sheets

SEMICONDUCTOR MEMORY DEVICE WITH REDUCED COUPLING NOISE

This application is based upon and claims the benefit of priority from Japanese Patent Application No. 2007-331571 filed on Dec. 25, 2007, the content of which is incorporated by reference.

BACKGROUND OF THE INVENTION

1. Field of the Invention

The present invention relates to a semiconductor memory device, and more particularly relates to a technology effective when applied to a semiconductor memory device that uses vertical MIS (Metal Insulator Semiconductor) transistors.

2. Description of Related Art

The miniaturization of memory cell transistors is the most effective means for realizing higher integration of dynamic random access memory (hereinbelow abbreviated as "DRAM"). Miniaturizing the feature size (F) enables the reduction of the size of memory cell transistors and improves integration. In addition, compressing cell size by altering cell mode as in 6F2 and 4F2 cells is also important. In a 4F2 cell, vertical MOS (metal oxide semiconductor) transistors must be used as access transistors. In cells of the related art, storage nodes are present between word lines and provide a shielding effect, but when vertical MOS transistors are used, word lines are directly adjacent to each other. As a result, the capacitance between word-lines occupies a greater proportion of the total capacitance of word lines.

Problems that arise as a result will be explained using an example of the configuration of a memory array. The memory array of FIG. 1 is composed of a plurality of memory cells MC, memory cell MC being made up from one MOS transistor and one capacitor Cs. One of the source or drain of a MOS transistor is connected to bit line BL0, BL1, ... BLn, the other of the source or drain is connected to storage node SN, and the gate is connected to word lines WL0, WL1, WL2, WL3, WL4, WL5, WL6, and WL7. Adjacent parasitic capacitances C01, C12, C23, C34, C45, C56, and C67 of length L of the word line are present between each of the word lines.

In addition, sub-word drivers SWD for driving word lines are arranged alternately to the right and left at one end of each word line. In this case, when WL2 is selected as a word line selection operation, the level of this word line becomes high level, and the other non-selected word lines are maintained at low level. However, the levels of adjacent non-selected word lines WL1 and WL3 are raised due to the coupling noise generated through the parasitic capacitance C12 between word line WL2 and word line WL1 and the parasitic capacitance C23 between word line WL2 and word line WL3. The levels of non-selected word lines WL1 and WL3 that are adjacent to word line WL2 therefore increase and the data of memory cells that are connected to word lines WL1 and WL3 leak to bit lines, thereby raising the problem of the likelihood of data destruction.

In relation to this problem, twist connector WCA2 is provided in Japanese Patent Laid-open Publication No. 167572/2001 (hereinbelow referred to as Patent Document 1) for switching the order of arrangement of word lines among the word lines as shown in FIG. 2, whereby adjacent word lines are altered. For example, focusing on word line WL1, although the number of adjacent word lines increases to the four word lines of WL0, WL2, WL3, and WL6, the length of the portion that is adjacent to each word line is reduced by one-half and the parasitic capacitance is also reduced by one-half, whereby the coupling noise received by adjacent word lines can be reduced.

In addition, Japanese Patent Laid-open Publication No. 268173/94 (hereinbelow referred to as Patent Document 2) discloses that coupling noise received by adjacent word lines can be reduced by arranging a level-stabilizing circuit made up from a plurality of SGT (Surrounding Gate Transistors) for each word line to maintain adjacent word lines unchanged at a low level.

However, the advance in the miniaturization in DRAM and the employment of vertical MOS transistors in memory cells has led to an increase in the parasitic capacitance between adjacent word lines. In order to stabilize the operation of DRAM, a method such as described in Patent Document 1 must be employed to reduce the parasitic capacitance by repeatedly providing twist connectors for switching the order of arrangement of word lines. However, because memory cells MC cannot be arranged in the region below twist connectors, the repeated provision of twist connectors results in the drawback of increased chip size.

On the other hand, in Patent Document 2, although increasing the channel width of a level-stabilizing circuit or the arrangement of a plurality of level-stabilizing circuits can reduce coupling noise, both approaches entail the problem of increased chip size.

SUMMARY

In one embodiment, there is provided an semiconductor device that includes a plurality of word lines, a plurality of bit lines, a plurality of memory cells that are provided at the intersections of the plurality of word lines and the plurality of bit lines and each of that includes a MIS transistor and a memory element, a decoder circuit for selecting a plurality of word-lines, and a sense-amplifier circuit for determining information that is read from any of the plurality of memory cells to any of the plurality of bit lines; wherein twist connectors are provided for switching the wiring order of the plurality of word lines, and level-stabilizing circuits are arranged in the area below the twist connectors, for supplying the potential level of a non-selected state to the plurality of word lines of a non-selected state.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
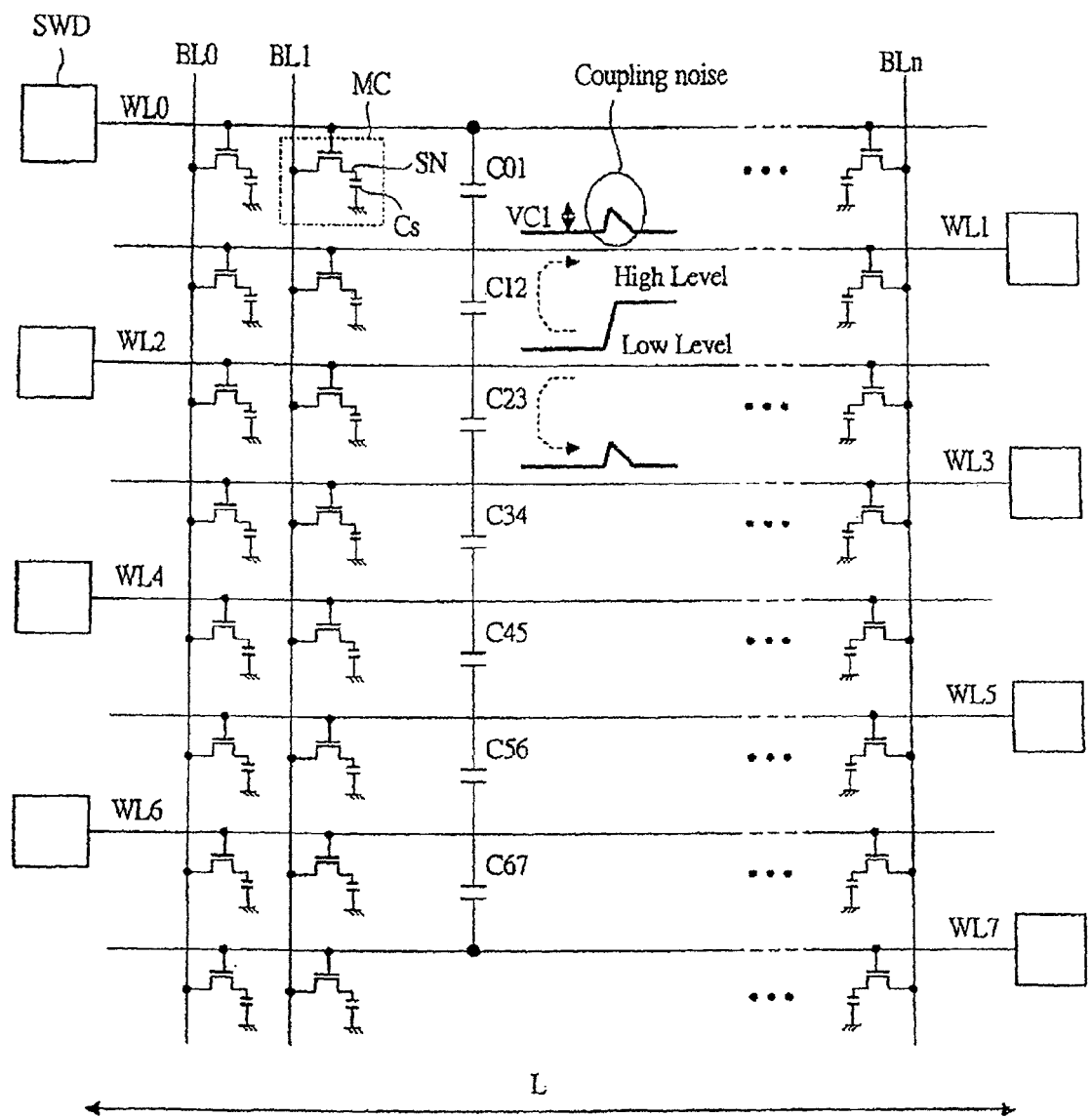
FIG. 1 is an explanatory view showing the problems in a related semiconductor memory device.

A brief explanation follows regarding the essentials of a representative example of the present invention disclosed in the present application.

The semiconductor memory device of an embodiment of the present invention is a configuration provided with a level-stabilizing circuit for supplying the non-selected voltage level to non-selected word lines in the area below twist connectors that twist word lines. The present embodiment thus enables a reduction of the coupling noise produced by way of parasitic capacitance between adjacent word lines while suppressing increase of chip size.

In a twist connector, a twist method is preferably employed in which twisting is implemented with eight word lines arranged adjacently as a unit such that, of four even-numbered word lines and four odd-numbered word lines contained in eight word lines, the four odd-numbered word lines are adjacent to one particular even-numbered word line and the four even-numbered word lines are adjacent to one particular odd-numbered word line. Adoption of this configuration enables arrangement of four level-stabilizing circuits that are connected to four even-numbered word lines in one row and arrangement of four level-stabilizing circuits that are connected to four odd-numbered word-lines in one row, and the adjacent arrangement of these level-stabilizing circuits enables arrangement of level-stabilizing circuits in two rows to realize a smaller area.

In the twist connector, the four word lines that are every other of the previously described eight word lines are preferably twisted. In this way, the wiring area that accompanies twisting can also be reduced in addition to the smaller area that accompanies the previously described arrangement in two rows to facilitate a further reduction of area.

The memory cell transistors that are connected to the word-lines preferably employ vertical MIS transistors, and the level-stabilizing circuits also preferably employ vertical MIS transistors. The use of vertical MIS transistors enables a reduction of the area of the area of arrangement of memory cells that includes the twist connectors (higher integration). On the other hand, although an increase in coupling noise accompanies this higher integration, a decrease of coupling noise is achieved by the use of the previously described configuration.

Embodiments of the present invention are next explained with reference to the accompanying figures. As a rule, identical parts are given identical reference numbers in all of the figures for explaining the embodiments and redundant explanations are omitted.

Although explanation is given in the following embodiments by dividing into a plurality of embodiments or sections when necessary for the sake of convenience, except where clearly stated, these embodiments are not unrelated to each other, one being the modification, details, or supplementary explanation of all or a portion of the others.

In addition, reference that is made to the number of elements (including numbers, numerical values, amounts, and ranges) in the following embodiments does not limit the present invention to this specific number and number of elements may be greater than or less than a specific number except when clearly stated or when fundamentally and obviously limited to the specific number. Still further, the constituent elements (including for example element steps) in the following embodiments are not necessarily indispensable except when particularly stated or when the elements can be considered as fundamentally and obviously indispensable.

Similarly, when reference is made to, for example, the shape or positional relations of constituent elements in the following embodiments, the present invention is assumed to include, for example, forms that substantially resemble or approximate these shapes or positional relations except where specifically stated or when the shape or positional relation is considered to fundamentally or obviously differ. These stipulations similarly apply to the above-described numerical values and ranges.

First Embodiment

Figure 3:
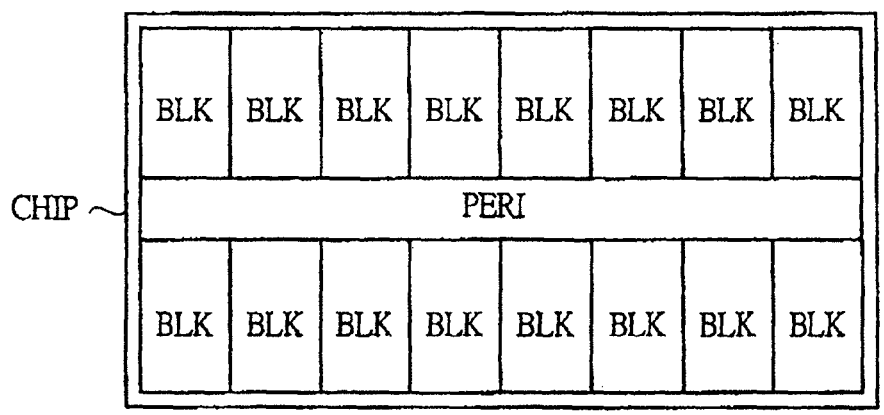
FIG. 3 is a block diagram showing an example of the overall configuration in the semiconductor memory device according to the first embodiment of the present invention.

FIG. 3 is a block diagram showing an example of the overall configuration in a semiconductor memory device according to the first embodiment of the present invention.

The semiconductor memory device shown in FIG. 3 is, for example, a DRAM chip, and is of a configuration provided with, in chip (shown as CHIP in FIG. 3), peripheral circuits PERI that include control circuits and input/output circuits, and a plurality of memory blocks BLK. Clocks, addresses, and control signals are applied as input to the control circuits from outside the chip, and the determination of operation modes of the chip and predecoding of addresses are carried out in the control circuits. The input/output circuits are provided with input/output buffers, receive write data as input from outside the chip, and supply read data to outside the chip.

Figure 4:
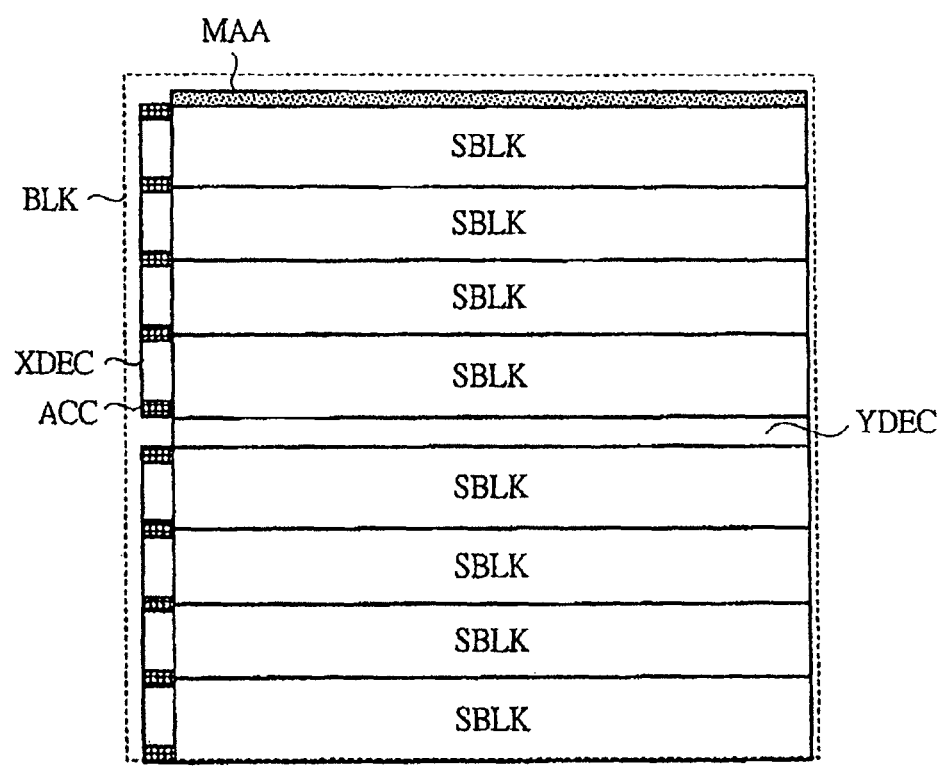
FIG. 4 is a block diagram showing an example of the configuration of the memory block of FIG. 3.

FIG. 4 is a block diagram showing an example of the configuration of memory block BLK of FIG. 3.

A plurality of memory sub-blocks SBLK are arranged in memory block BLK, and row decoders XDEC, array control circuits ACC, and main amplifier columns MM are arranged around the perimeter of memory blocks BLK. Column decoder YDEC that is parallel to main amplifier column MM is arranged in the center of the memory blocks.

Figure 5:
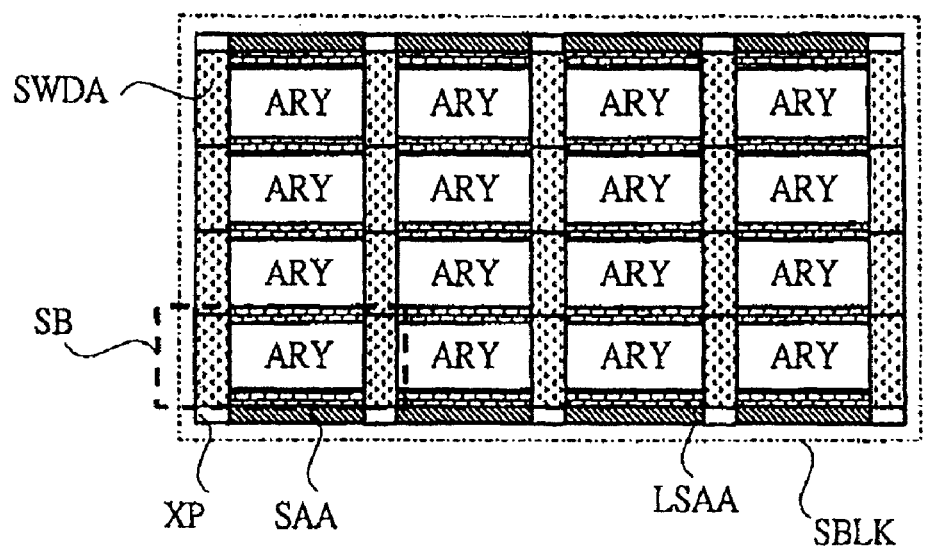
FIG. 5 is a block diagram showing an example of the configuration of the memory sub-block of FIG. 4.

FIG. 5 is a block diagram showing an example of the configuration of memory sub-block SBLK of FIG. 4.

A plurality of memory arrays ARY are arranged in memory sub-block SBLK, and sense-amplifier rows SAA, sub-word driver rows SWDA and cross-area XP are arranged on the peripheries of ARY. A hierarchical bit-line configuration is here employed, and local sense-amplifier rows LSAA are arranged between memory arrays parallel to the sense-amplifier rows.

Figure 6:
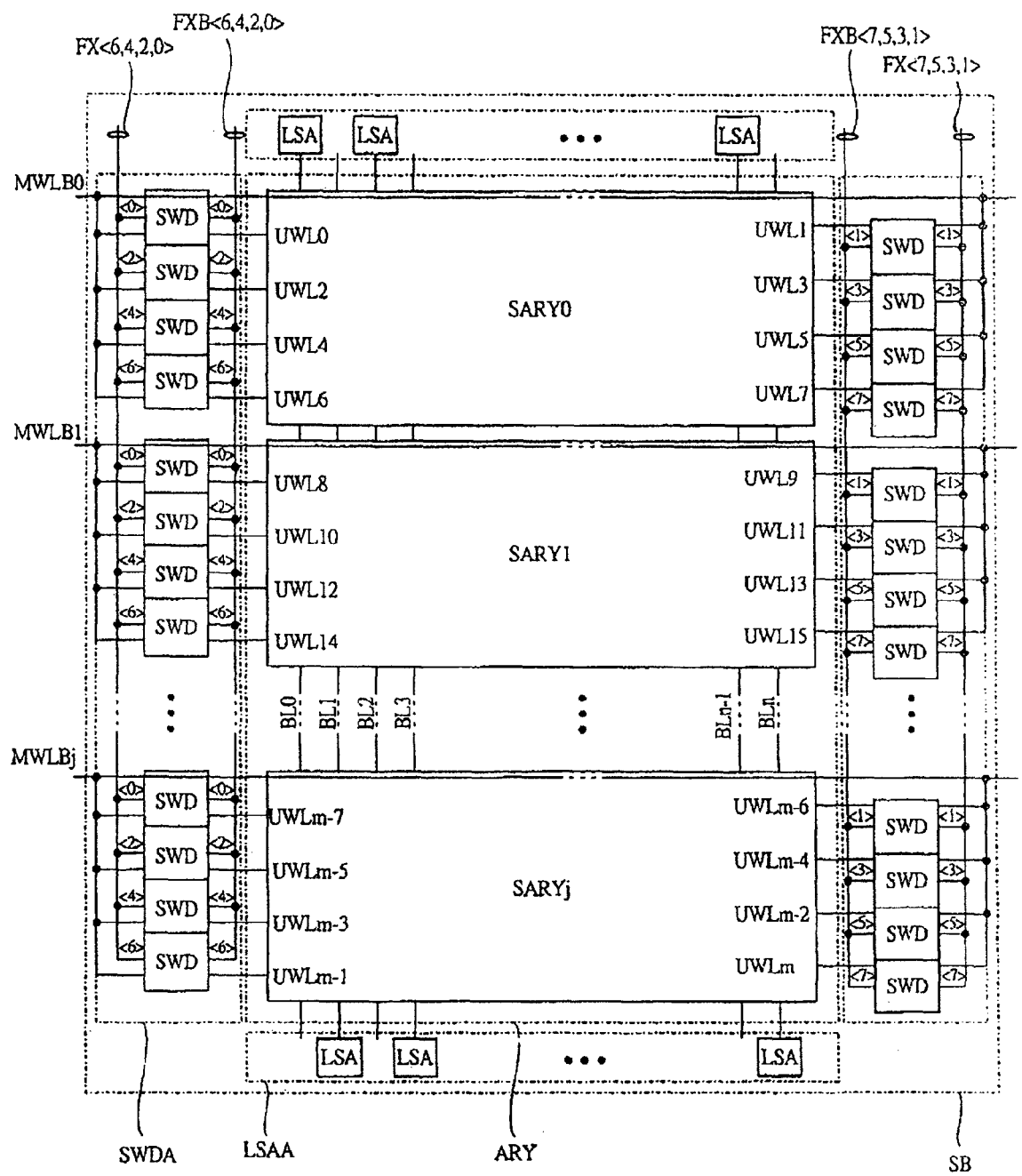
FIG. 6 is a block diagram showing an example of the configuration of the sub-block enclosed by the local sense-amplifier rows and sub-word driver rows in FIG. 5.

FIG. 6 is a block diagram showing an example of the configuration of sub-block SB that is enclosed by sub-word driver row SWDA and local sense-amplifier row LSAA in FIG. 5.

A plurality of memory sub-arrays SARY0-SARYj are arranged in succession on sub-block SB in the direction of extension of bit lines BL. Each SARY includes eight word lines WL, (n+1) bit lines BL0-BLn, and, although not shown, a memory cell at each intersection of word lines and bit lines that intersect with each other.

These eight word lines WL are each connected to a respective one of eight sub-word drivers SWD that are included in sub-word driver row SWDA, and the (n+1) bit lines BL0-BLn are each connected to a respective one of (n+1) local sense-amplifiers LSA included in local sense-amplifier row LSAA.

In addition, the eight corresponding sub-word drivers SWD for each of these memory sub-arrays SARY0-SARYj are controlled by one main word line MWLB and sixteen FX lines (FX0-FX7 and their inverted signals FXB0-FXB7). In other words, for example, the eight SWD that correspond to SARY0 are separately controlled by MWLB0, and the eight SWD that correspond to SARYj are separately controlled by MWLBj, and in addition, these SWD are in turn controlled in common by the sixteen FX lines.

Figure 7:
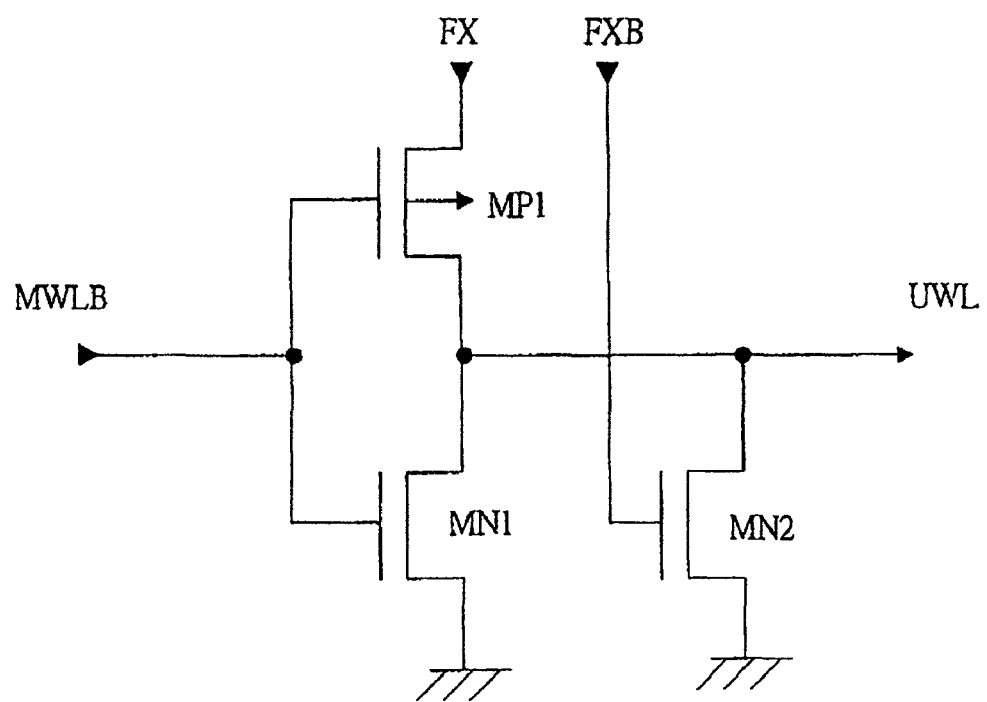
FIG. 7 is a circuit diagram showing the details of an example of the configuration of each sub-word driver in FIG. 6.

FIG. 7 is a circuit diagram showing the details of an example of the configuration of each sub-word driver SWD in FIG. 6.

SWD in FIG. 7 is made up from PMOS transistor MP1 for pulling up word line WL (upper-level word line UWL) to the selected level and NMOS transistors MN1 and MN2 for pulling down upper-level word line UWL to the non-selected level. The gates of MP1 and MN1 are driven by main word-line MWLB, and the selected level of the word-line when MP1 is driven to ON is supplied by FX line (shown as FX in FIG. 7). The gate of MN2 is driven by FX line (shown as FXB in FIG. 7) that is the inverted signal.

When a configuration of this type is used to select, for example, upper-level word-line UWL0 of SARY0 in FIG. 6, MWLB0 is driven to "L" level and FX0 is driven to "H" level (FXB0 is driven to "L" level), and the remaining MWLB1-MWLBj are maintained at the "H" level and FX1-FX7 are maintained at the "L" level (FXB1-FXB7 are maintained at the "H" level). In this way, upper-level word-line UWL0 is driven to the voltage level of FX0 and the remaining upper-level word-lines UWL1-UWLm are maintained at the non-selected level by way of MN1 and/or MN2.

Figure 8:
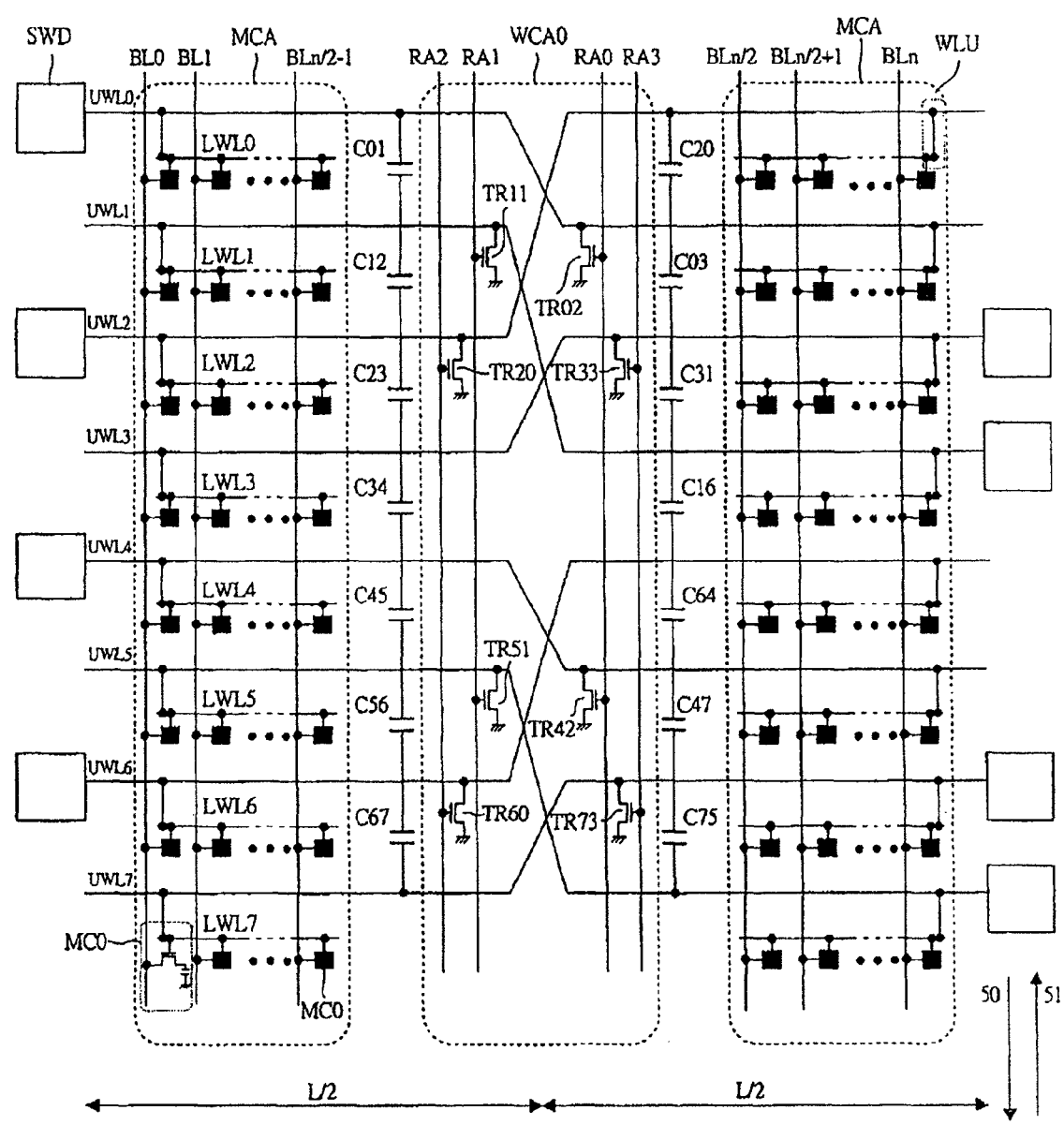
FIG. 8 is a circuit diagram showing an example of the configuration of the memory sub-array in FIG. 6.

FIG. 8 is a circuit diagram showing the details of an example of the configuration of a memory sub-array SARY in FIG. 6.

Memory sub-array SARY is made up from a plurality of memory cells MC0, each MC0 being composed of one MOS transistor and one capacitor. Either the source or the drain of the MOS transistor is connected to bit-line BL0, BL1, ..., BLn, the other of the source or drain is connected to the capacitor, and the gate is connected to lower-level word-lines LWL0-LWL7. Although a MOS transistor is used as an example of the MIS transistor in the present embodiment, the present invention is of course not limited to a MOS transistor.

In a vertical MOS transistor, a two-layer construction is preferably employed in which lower-level word-lines are shunted by upper-level word-lines UWL0-UWL7 because the resistance of word-lines becomes high. In other words, a configuration may be used as shown in FIG. 8 in which lower-level word-lines LWL are connected to upper-level word-lines UWL by way of contacts in shunt area WLU. Although no particular limitation applies, a shunt is implemented for each 32 memory cells MC0 that are arranged. Word-lines include two types, upper-level word-lines and lower-level word-lines, but when expressing the word-lines, the expression word-lines WL0-WL7 is assumed to include both upper-level word-lines UWL0-UWL7 and lower-level word-lines LWL0-LWL7.

Sub-word drivers SWD for driving word-lines are arranged at one end of each upper-level word-line UWL, sub-word drivers SWD being arranged alternately to the left and right for each disposition of a word-line. A principal characteristic of the present first embodiment is the arrangement of twist connector WCA0 for switching the order of wiring of word-lines WL in substantially the center of word-lines WL, and the arrangement of level-stabilizing circuits TR02, TR11, TR20, TR33, TR42, TR51, TR60, and TR73 for supplying the voltage level of the non-selected state of word-lines WL in the area below the twist connector.

The twist connection for switching the order of wiring of word-lines WL will first be explained. The twist for switching the wiring order of word-lines WL is implemented by upper-level word-lines UWL, and lower-level word-lines LWL are disconnected at both ends of twist connector WCA0. In the twist connector for switching the wiring order of word-lines, switching the wiring order of upper-level word-lines UWL suppresses the parasitic capacitance between the same adjacent word-lines to a low level.

More specifically, looking from the left side of twist connector WCA0, twist connector shifts upper-level word-line UWL0 by one word-line in the direction of arrow 50, shifts upper-level word-line UWL1 by two word-lines in the direction of arrow 50, shifts upper-level word-line UWL2 by two word-lines in the direction of arrow 51, and shifts upper-level word-line UWL3 by one word-line in the direction of arrow 51. In addition, upper-level word-line UWL4 is shifted by one word-line in the direction of arrow 50, upper-level word-line UWL5 is shifted by two word-lines in the direction of arrow 50, upper-level word-line UWL6 is shifted by two word-lines in the direction of arrow 51, and upper-level word-line UWL7 is shifted by one word-line in the direction of arrow 51.

As a result, the wiring order of upper-level word-lines becomes UWL2, UWL0, UWL3, UWL1, UWL6, UWL4, UWL7, and UWL5 in the direction of arrow 50 on the right side of twist connector WCA0. In the lower-level word-lines as well, the wiring order becomes LWL2, LWL0, LWL3, LWL1, LWL6, LWL4, LWL7, and LWL5 in the direction of arrow 50. This switching of the wiring order of the word-lines results in four word-lines adjacent to a particular word-line of interest. When the length of a word-line is L, the length over which one adjacent word-line is adjacent to the word-line of interest is L/2, and the capacitance between the word-lines is also approximately one-half. The parasitic capacitance is thus divided by changing adjacent word-lines without changing the total parasitic capacitance of the word-line of interest.

Looking at the circuit operation, when, for example, word-line WL1 is driven as a selected word-line, the other word-lines WL0, WL2, WL3, WL4, WL5, WL6, and WL7 become non-selected word-lines and adjacent word-lines WL0, WL2, WL3, and WL6 receive the coupling noise by way of parasitic capacitance C01, C12, C31, and C16 between these word-lines and selected word-line WL1. The levels of adjacent word-lines WL0, WL2, WL3, and WL6 rise due to the coupling noise, but the switching of the wiring order of word-lines enables a reduction of the parasitic capacitance between adjacent word-lines by substantially half, whereby the coupling noise can also be reduced by approximately half.

Explanation next regards the level-stabilizing circuits for supplying the level of the non-selected state of word-lines that are arranged in the area below the twist connector that switches the wiring order of the word-lines. The level-stabilizing circuits are made up from one MOS transistor for one word-line, one of the source or drain of the MOS transistor being connected to the power-supply voltage that is the level of the non-selected state of word-lines, and the other of the source or drain being connected to the upper-level word-line.

The gates of level-stabilizing circuits TR02 and TR42 of upper-level word-lines UWL0 and UWL4 are connected to control signal line RA0, the gates of level-stabilizing circuits TR11 and TR51 of upper-level word-lines UWL1 and UWL5 are connected to control signal line RA1, the gates of level-stabilizing circuits TR20 and TR60 of upper-level word-lines UWL2 and UWL6 are connected to control signal line RA2, and the gates of level-stabilizing circuits TR33 and TR73 of upper-level word-lines UWL3 and UWL7 are connected to control signal line RA3. The control signals of the level-stabilizing circuits are signals controlled by decoding signals of addresses that are received as input through RA0, RA1, RA2, and RA3 from outside the chip. Connecting level-stabilizing circuits to upper-level word-lines in this way suppresses the increase in level of non-selected word-lines caused by coupling noise generated by way of parasitic capacitance.

To explain the circuit operation, when, for example, word-line WL1 is driven as the selected word-line, the other word-lines WL0, WL2, WL3, WL4, WL5, WL6, and WL7 become non-selected word-lines. Control signal line RA1 that is connected to the gate of level-stabilizing circuit TR11 that is connected to word-line WL1 is assumed to be low-level when word-line WL1 is selected and is level-stabilizing circuit TR11 is assumed to be in the non-selected state. The other control signal lines RA0, RA2, and RA3 are kept unchanged at high level, and the level-stabilizing circuits in which gates are connected to the other control signal lines RA0, RA2, and RA3 are kept unchanged in the selected state.

Figure 2:
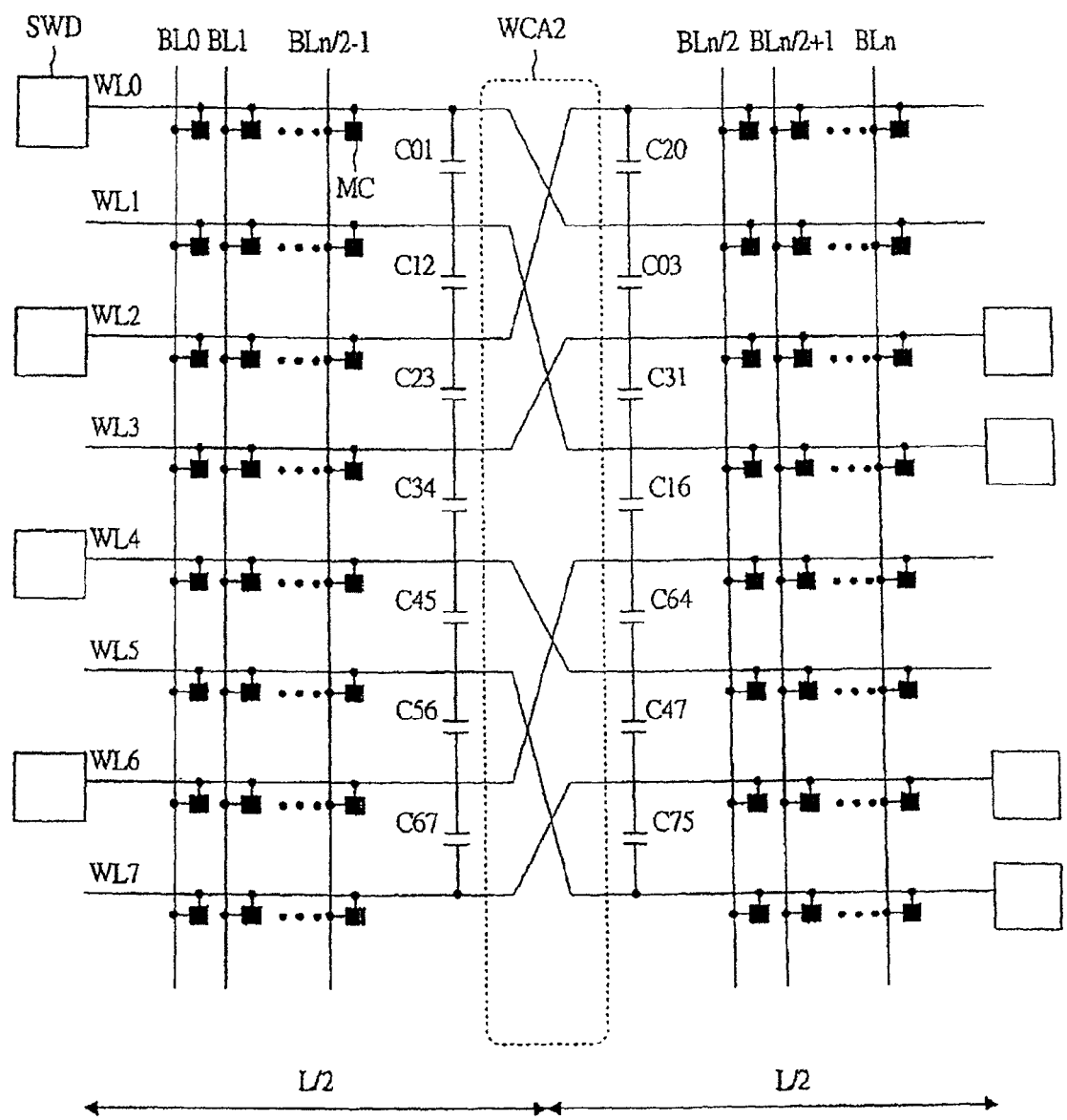
FIG. 2 is a circuit diagram showing an example of the configuration in a related semiconductor memory device.

As a result, when word-line WL1 is selected and the level of this word-line WL1 becomes high level, the level-stabilizing circuits that are connected to word-lines WL0, WL2, WL3, and WL6 that are adjacent to WL1 are set in the selected state, whereby the coupling noise produced by way of parasitic capacitance C01, C12, C31, and C16 between the word-lines can be suppressed. Accordingly, the arrangement of the twist connection for switching the wiring order of the word-lines and the level-stabilizing circuits in the area below the twist connection can decrease the coupling noise produced by way of the parasitic capacitance between the adjacent word-lines by, for example, 47% compared to a case in which word-lines are simply twisted as shown in FIG. 2.

Figure 9:
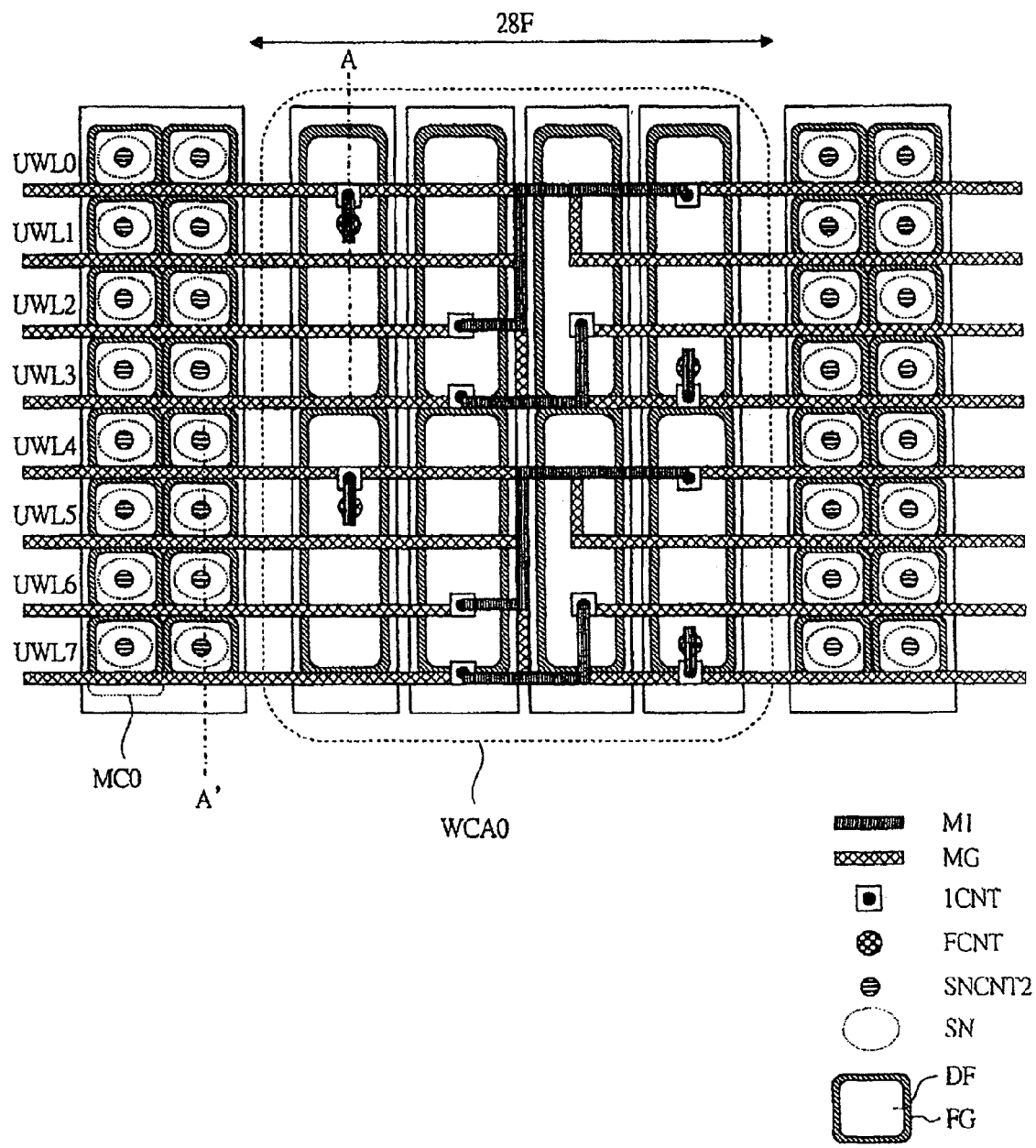
FIG. 9 is a plan view showing an example of the layout configuration in the vicinity of the twist connector of FIG. 8.
Figure 10:
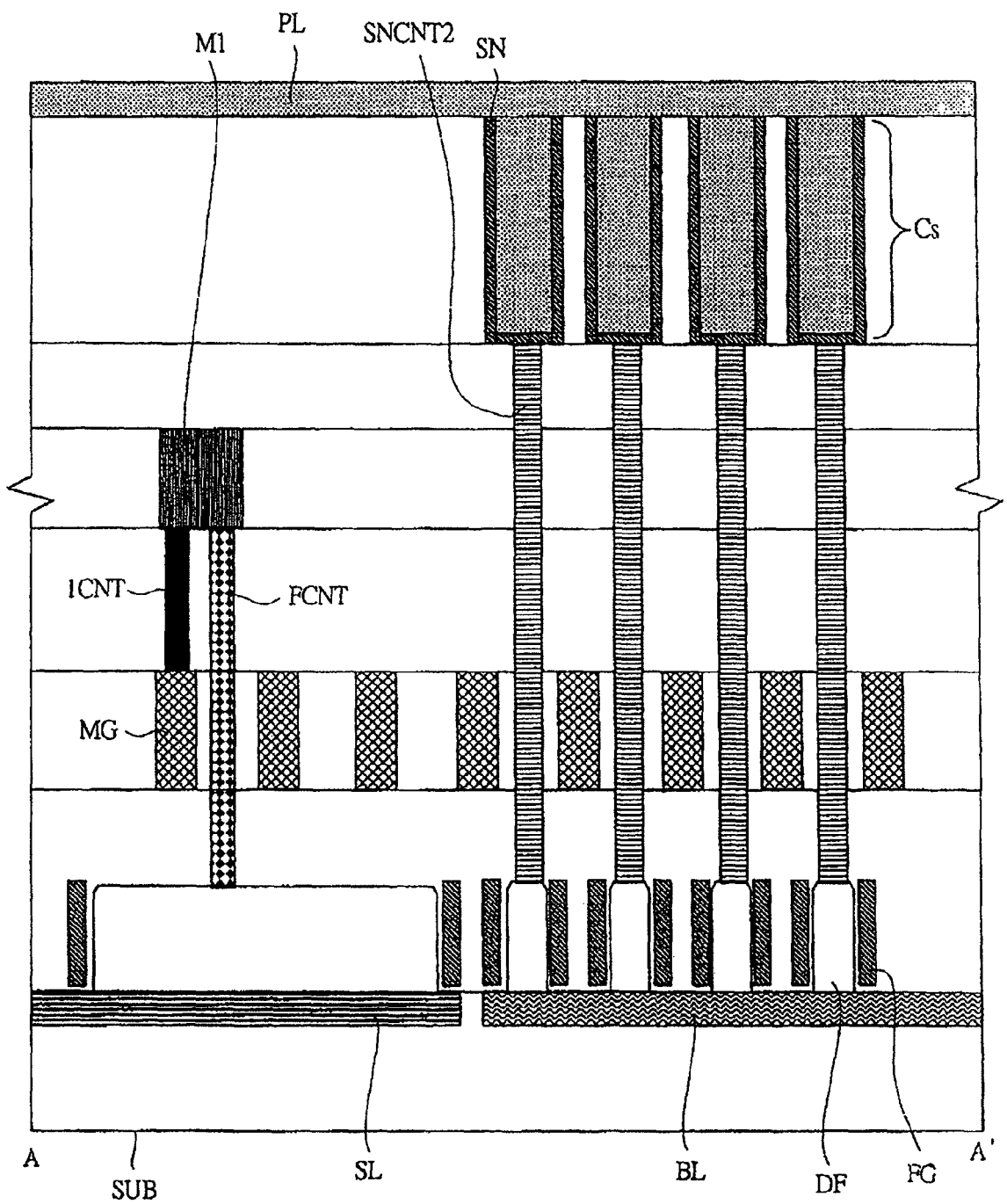
FIG. 10 is a sectional view showing an example of the configuration taken along line A-A' of FIG. 9.

Here, FIG. 9 shows a plan layout of the twist connector for switching the wiring order of word-lines and the level-stabilizing circuits arranged in the area below the twist connector, and FIG. 10 shows a sectional view taken along line A-A' in FIG. 9. FIG. 9 shows twist connector WCA0 for switching the wiring order of the word-lines, level-stabilizing circuits arranged in the area below the twist connector, and a plurality of memory cells MC0 arranged on both ends of WCA0. The MOS transistors of memory cells MC0 are made up of vertical MOS transistors.

As shown in FIG. 10, one of the source and drain is formed on the top of semiconductor layer DF that is formed in a columnar shape and is connected to storage node SN of capacitor CS by capacitance contact SNCNT2. The other capacitor is connected to plate electrode PL. The other of the source and drain is formed on the bottom of semiconductor layer DF that is formed in a columnar shape and connected to bit-line BL. In addition, gate FG is formed around the side surface of semiconductor layer DF with a gate insulating film interposed. Gate FG is lower-level word-line LWL. Upper-level word-line UWL is formed by the first wiring layer MG. In contrast to upper-level word-lines UWL0 and UWL1 that are simply formed by bends in first wiring layer MG of the twist connector for switching upper-level word-lines, upper-level word-lines UWL2 and UWL3 realize intersecting wiring by drawing the wiring from first wiring layer MG by way of second wiring layer M1 in the twist connector. First wiring layer MG and second wiring layer M1 are connected by first contact 1CNT.

The twist connection of the upper-level word-lines can be formed in units of four upper-level word-lines, and when a multiplicity of upper-level word-lines are arranged, the wiring order of all word-lines can be switched by successively carrying out word-line twist connections in units of four word-lines. Since memory cell MC0 cannot be arranged in the area below a twist connector for switching the wiring order of word-lines, this lower area is used to form level-stabilizing circuits.

The level-stabilizing circuits are also formed by vertical MOS transistors, and the top of semiconductor layer DF that is formed in a columnar shape connects with second wiring layer M1 that is the upper-level word-lines by way of second contact FCNT. The bottom of semiconductor layer DF that is formed in a columnar shape connects to source line SL to which a power-supply voltage having a stabilized level (the non-selected voltage level of word-lines) is supplied. The gates that are connected by way of gate insulating film around the side surfaces of the semiconductor layer formed in a columnar shape are connected to control signal lines RA0, RA1, RA2, and RA3 for controlling the level-stabilizing circuits. In this case, the control signals of the level-stabilizing circuits that are connected to four upper-level word-lines UWL0, UWL1, UWL2, and UWL3 each differ from each other, thereby necessitating the separation of gates FG and the need for four rows of level-stabilizing circuits as shown in FIG. 9. Accordingly, the size of twist connector WCA0, in which the wiring for switching the wiring order of word-lines and level-stabilizing circuits are arranged, is 28F.

Figure 11:
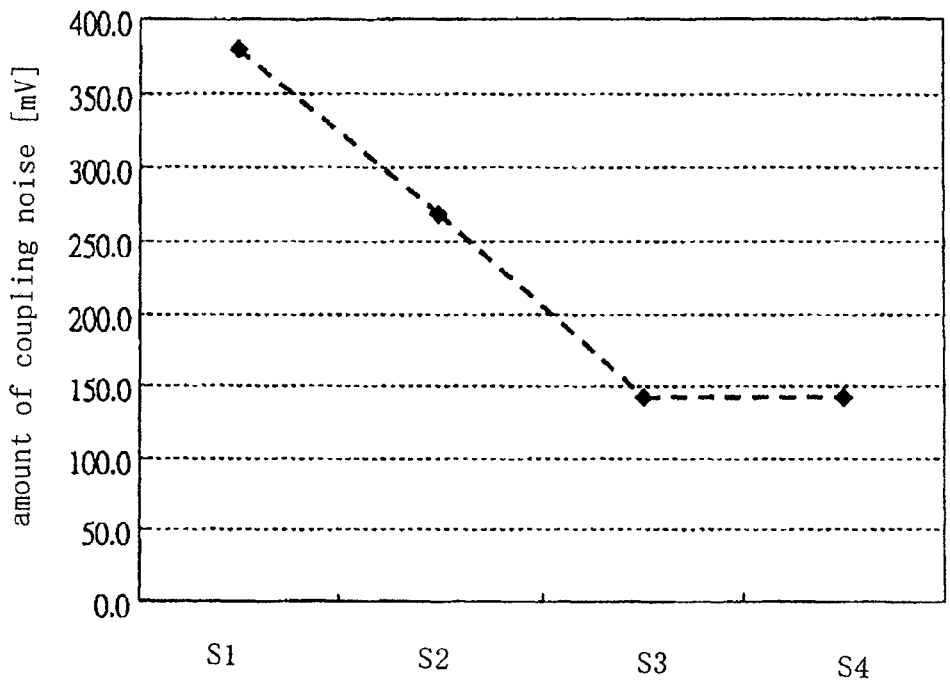
FIG. 11 is an explanatory view showing the effect of the present embodiment.
Figure 12:
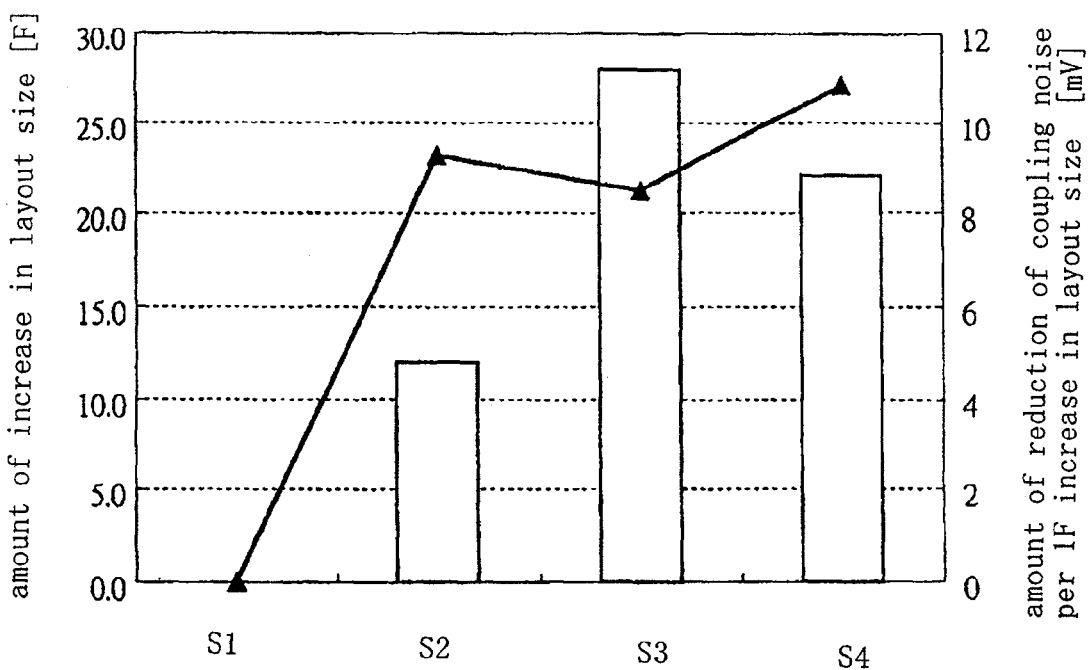
FIG. 12 is an explanatory view showing the effect of the present embodiment.

The effects realized by this first embodiment are next explained using FIGS. 11 and 12.

Regarding the direction of the horizontal axis of FIG. 11 and FIG. 12, the data of S1 are for the case of the related art shown in FIG. 1, and the data of S2 are for the case of the related art that applies the method of reducing coupling noise disclosed in Patent Document 1 and shown in FIG. 2. The data of S3 are for the case of this first embodiment shown in FIG. 8.

FIG. 11 shows amount of coupling noise [mV] that is generated in adjacent word-lines, and FIG. 12 shows the amount of increase in layout size [F] and the amount of reduction of coupling noise per 1F increase in layout size. This amount of coupling noise is a value computed by circuit simulation that uses a memory array model.

As shown in FIG. 11, using S3 of the present first embodiment enables a reduction in the amount of coupling noise on the order of 63% compared to S1 of the related art, and further, a reduction on the order of 17% compared to S2 of the related art. Regarding the layout size, as shown by the bar graph of FIG. 12, the arrangement of wiring for switching the wiring order of word-lines and level-stabilizing circuits realizes an increase of as much as 28F compared to S1 of the related art and as much as 16F compared to S2 of the related art.

However, regarding the amount of decrease in coupling noise per 1F increase in layout size as shown by the line graph of FIG. 12, compared to the 9.25 mV decrease in coupling noise per 1F increase in layout size for S2 of the related art, the amount of decrease for S3 of the present first embodiment was a substantially equal level of 8.5 mV.

However, with regard to the absolute level of the amount of coupling noise shown in FIG. 11, in order to achieve a level equivalent to that of S3 of the present first embodiment, S2 of the related art necessitated, for example, the arrangement of twist connectors for switching the wiring order of word-lines in a plurality of locations (i.e., twisting must be carried out two or more times). Such a configuration raises the problems of increased complexity of layout, an attendant increase in area, and in some cases, the danger of detracting from the amount of decrease in coupling noise per 1F increase in layout size. The use of the configuration of the present first embodiment, in contrast, allows a decrease in the absolute level of the amount of coupling noise with a simple layout, and further, can maintain the efficiency of decreasing noise with respect to increase in area at a level equivalent to that of S2 of the related art.

Second Embodiment

Figure 13:
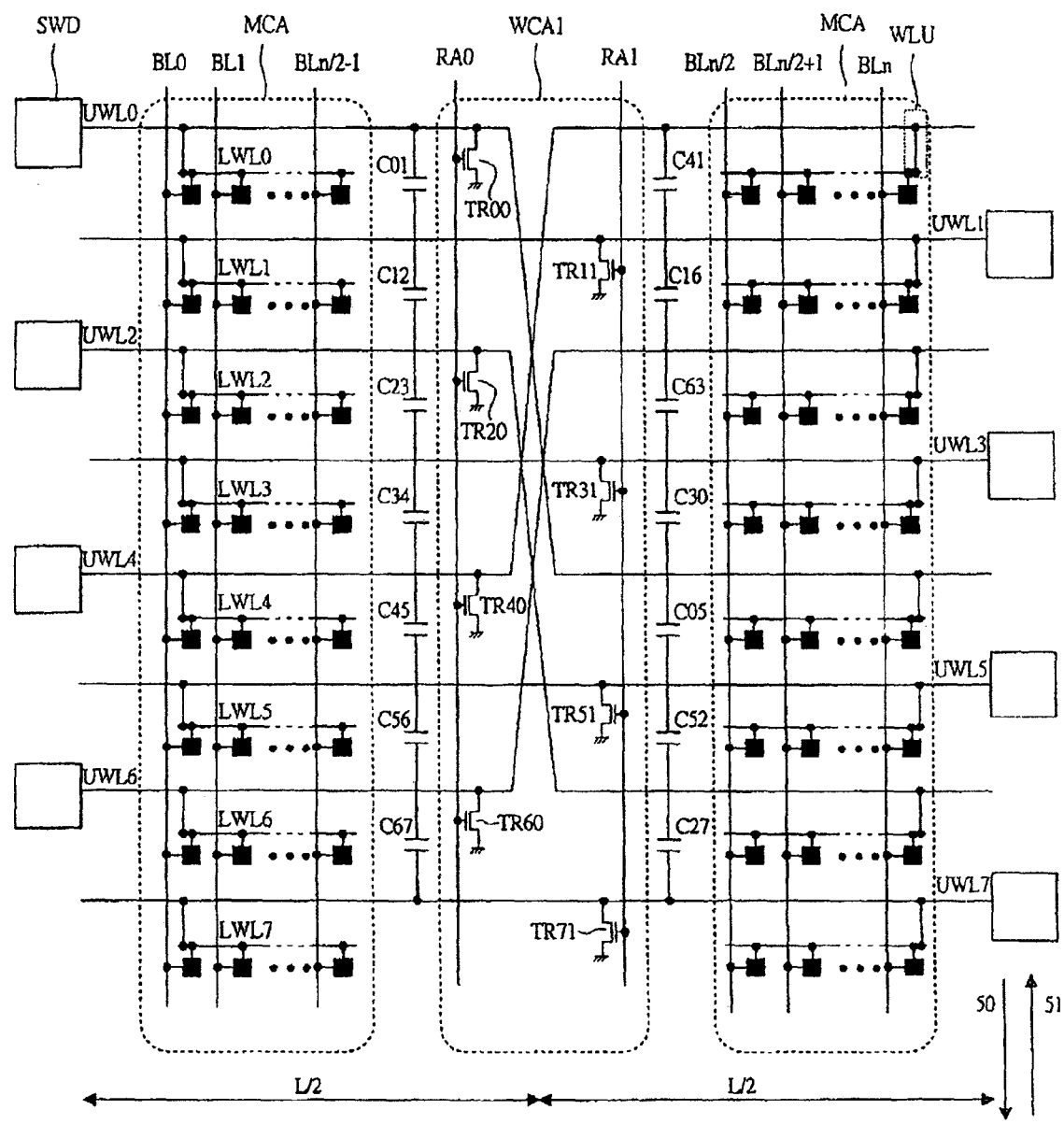
FIG. 13 is a circuit diagram showing the details of an example of the configuration of the memory sub-array in FIG. 6 in the semiconductor memory device according to the second embodiment of the present invention.

FIG. 13 is a circuit diagram showing details of an example of the configuration of memory sub-array SARY in FIG. 6 in the semiconductor memory device according to the second embodiment of the present invention.

Figure 14:
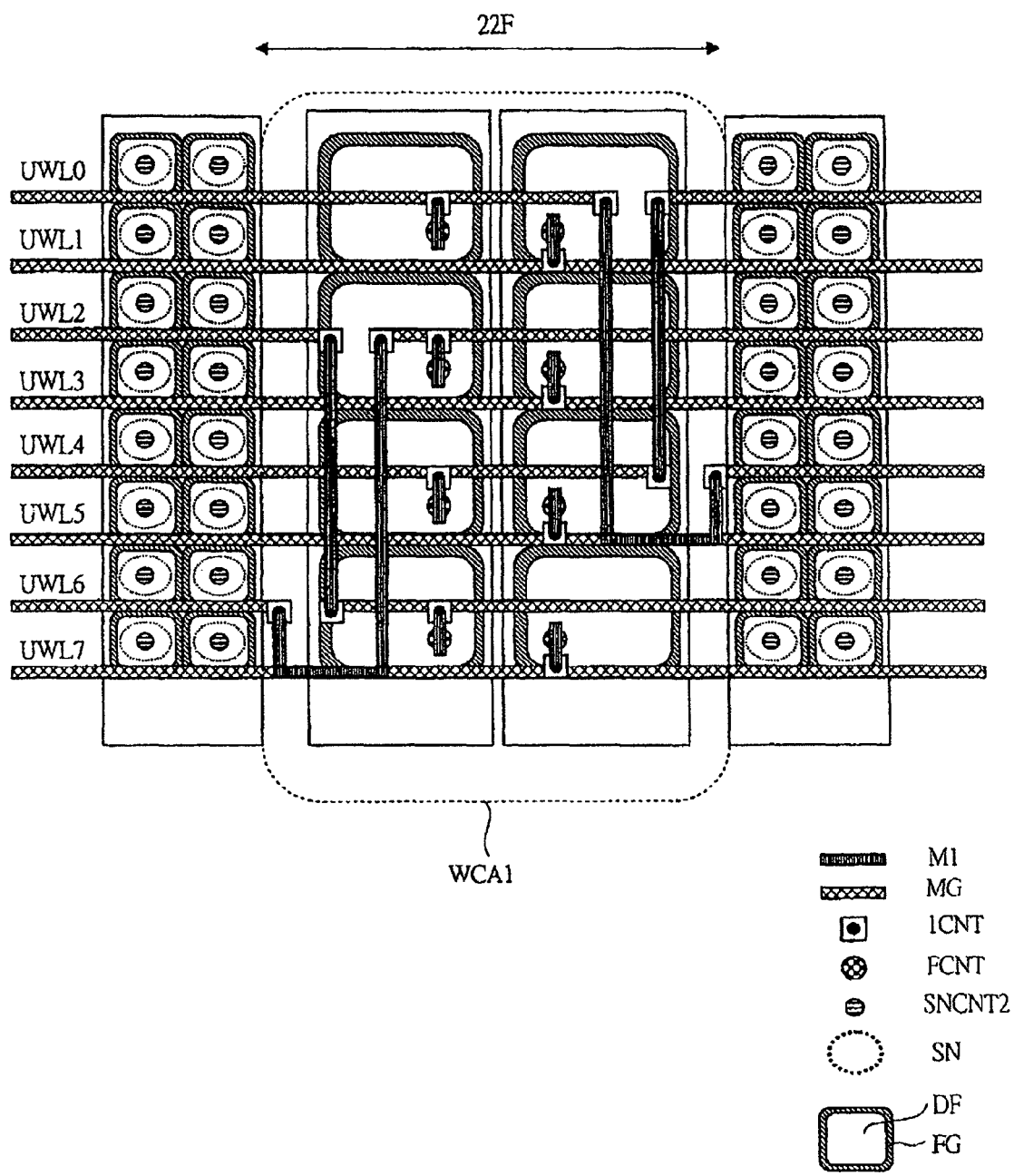
FIG. 14 is a plan view showing an example of the layout configuration in the vicinity of the twist connector of FIG. 13.

FIG. 14 is a plan view showing an example of the layout configuration of twist connector WCA1 for switching the wiring order of word-lines in FIG. 13 and level-stabilizing circuits arranged in the area below twist connector WCA1 for supplying the level of the non-selected state of word-lines.

Compared to the example of the configuration of the first embodiment, the chief characteristic of the example of the configuration of the second embodiment is the two-column arrangement of level-stabilizing circuits that is achieved by altering the twist connection method for switching the wiring order of word-lines.

Explanation first regards the twist connection method for switching the wiring order of the word-lines. As shown in FIG. 13, as viewed from the left side of twist connector WCA1, the twist connector shifts upper-level word-line UWL0 by four word-lines in the direction of arrow 50 and does not switch the wiring order of upper-level word-line UWL1. Upper-level word-line UWL2 is shifted by four word-lines in the direction of arrow 50, but the wiring order of upper-level word-line UWL3 is not switched. Upper-level word-line UWL4 is shifted by four lines in the direction of arrow 51, but the wiring order of upper-level word-line UWL5 is not switched. Upper-level word-line UWL 6 is shifted by four word-lines in the direction of arrow 51, but the wiring order of upper-level word-line UWL7 is not switched.

As a result, the wiring order of word-lines becomes UWL4, UWL1, UWL6, UWL3, UWL0, UWL5, UWL2, and UWL7 in the direction of arrow 50 on the right side of twist connector WCA1. In the lower-level word-lines as well, the wiring order becomes LWL4, LWL1, LWL6, LWL3, LWL0, LWL5, LWL2, and LWL7 in the direction of arrow 50. Essentially, the twist connection of the word-lines is formed in units of eight lines with four alternating word-lines being twisted. When a multiplicity of word-lines are arranged, repeated formation of twist connectors WCA1 in units of eight word-lines realizes twist for all word-lines, whereby the parasitic capacitance between each adjacent word-line can be reduced by substantially one-half and the coupling noise can also be reduced by approximately one-half, as in the case of the previously described first embodiment.

Explanation next regards the two-row arrangement of the level-stabilizing circuits.

RA0 is the control signal line of level-stabilizing circuits TR00, TR20, TR40 and TR60 that are connected to word-lines UWL0, UWL2, UWL4, and UWL6 that drive from the left direction, and RA1 is the control signal line of level-stabilizing circuits TR11, TR31, TR51, and TR71 that are connected to word-lines UWL1, UWL3, UWL5, and UWL7 that drive from the right direction. In this case, when the even-numbered side (0, 2, . . . , m−1) of word-lines WL is selected, the level-stabilizing circuits connected to this even-numbered side are set to the non-selected state, and the level-stabilizing circuits connected to the odd-numbered side (1, 3, . . . , m) of word-lines WL are set to the selected state. Conversely, When the odd-numbered side (1, 3, . . . m) of word-lines WL is selected, the level-stabilizing circuits connected to this odd-numbered side are set to the non-selected state, and the level-stabilizing circuits connected to the even-numbered side (0, 2, . . . , m−1) are set to the selected state.

Thus, because level-stabilizing circuits can be arranged in two rows in the twist method of the second embodiment as shown in FIG. 14, the layout size of twist connector WCA1, in which each of the wirings for realizing twist connections and level-stabilizing circuits are arranged, is 22F and a further reduction of chip size can be achieved than in the previously described first embodiment. In this case, the layout size of twist connector WCA1 is subject to the limits imposed by the area of the wiring necessary for implementing twist connections, and compressing the size to 14F (half of the 28F in FIG. 9) is therefore difficult.

However, the channel width of the level-stabilizing circuits can be increased to the extent that this compression cannot be realized, and channel width equivalent to that of the level-stabilizing circuits of FIG. 9 can therefore be guaranteed. In other words, from the standpoint of the area efficiency of the level-stabilizing circuits (vertical MOS transistors), although four rows must be divided by three separation areas in the four-row arrangement of FIG. 9, the two rows in the two-row arrangement of FIG. 14 can be divided by a single separation area to achieve an increase in area efficiency equivalent to two separation rows. As a result, channel width that is equivalent to the level-stabilizing circuits in the 28F of FIG. 9 can be guaranteed in the 22F of FIG. 14.

Regarding a description of circuit operation, when word-line WL2 is driven as the selected word-line, the other word-lines WL0, WL1, WL3, WL4, WL5, WL6, and WL7 become non-selected word-lines. Control signal line RA0 that is connected to the gate of level-stabilizing circuit TR20 that is connected to word-line WL2 is set to low level when word-line WL2 is selected and level-stabilizing circuit TR20 is set to the non-selected state. On the other hand, control signal line RA1 is kept unchanged at high level and level-stabilizing circuits TR11, TR31, TR51, and TR71 in which control signal line RA1 is connected to gates are kept unchanged in the selected state. As a result, although word-line WL2 is selected and its level becomes high level, the level-stabilizing circuits connected to word-lines WL1, WL3, WL5, and WL7 that are adjacent to word-line WL2 are in the selected state and the coupling noise generated by way of the parasitic capacitance C12, C23, C52, and C27 between the word-lines can therefore be suppressed.

Explanation next regards the effects realized by the present second embodiment using FIGS. 11 and 12.

The data of S4 on the horizontal axis of FIGS. 11 and 12 show the case of the present second embodiment. The amount of coupling noise generated by way of the parasitic capacitance between adjacent word-lines shown in FIG. 11 is the same as S3 of the first embodiment, but as shown in FIG. 12, the layout size of twist connector WCA1 in which each of the wirings for implementing twist connections and the level-stabilizing circuits are arranged can be reduced to 22F. As a result, the amount of decrease of coupling noise per 1F increase in layout size shown in FIG. 12 is as great as 10.8 mV, but if each specification is compared, the present second embodiment can decrease coupling noise while achieving a greater suppression of the increase in chip size. In addition, the present embodiment has the advantage of reducing the number of control signal lines RA compared to the first embodiment.

Figure 15A:
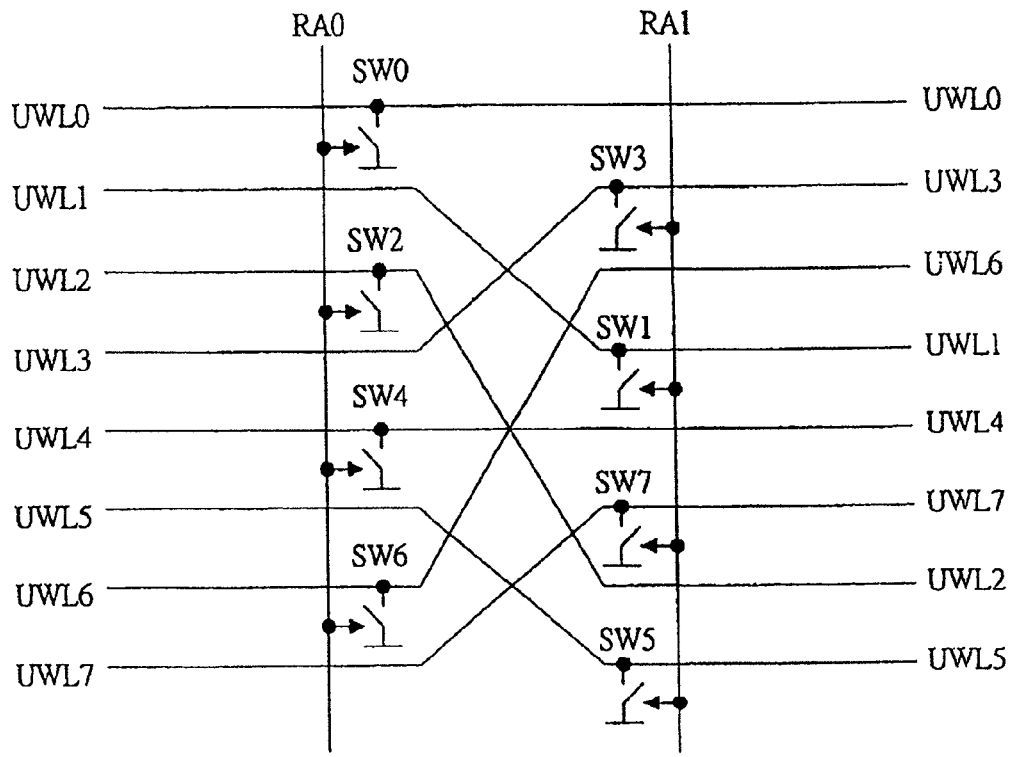
FIG. 15A and FIG. 15B are schematic views showing modifications of the word line twist method of FIG. 13 and each show a different word line twist method.
Figure 15B:
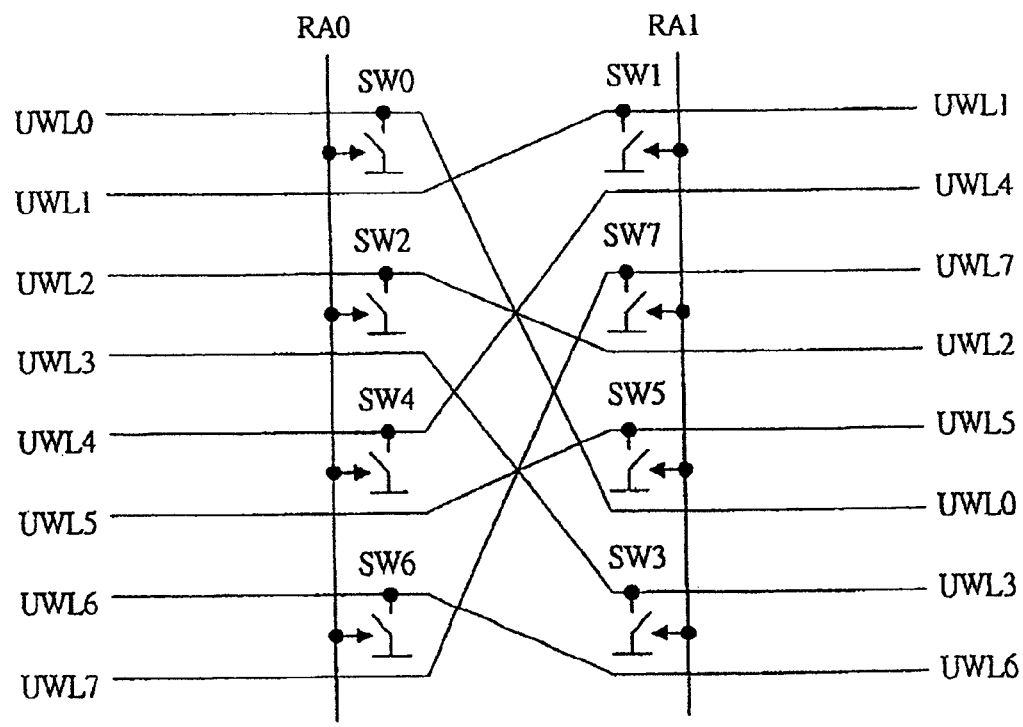

A plurality of other twist methods exist for realizing a layout in a two-row arrangement by placing four odd-numbered word-lines adjacent to a particular even-numbered word-line and placing four even-numbered word-lines adjacent to a particular odd-numbered word-line in units of eight word-lines composed of four even-numbered word-lines and four odd-numbered word-lines as in the example of the configuration of the second embodiment. As one example of these methods, a two-row arrangement of level-stabilizing circuits (switch circuits) SW0-SW7 is realized by not twisting two lines among eight word-lines and twisting the remaining six lines as in the twist method shown in FIG. 15A. Alternatively, in the twist method shown in FIG. 15B, a two-row arrangement of level-stabilizing circuits (switch circuits) SW0-SW7) is realized by twisting all eight lines.

The use of these twist methods can also obtain the same effects as previously described that accompany the two-row arrangement. However, increasing the number of twists results in a corresponding increase in the area of the wiring required for implementing the twists, as can be seen from FIG. 14, and from this standpoint, a configuration is preferable in which four word-lines among the eight word-lines are twisted as shown in FIGS. 13 and 14.

Third Embodiment

Figure 16:
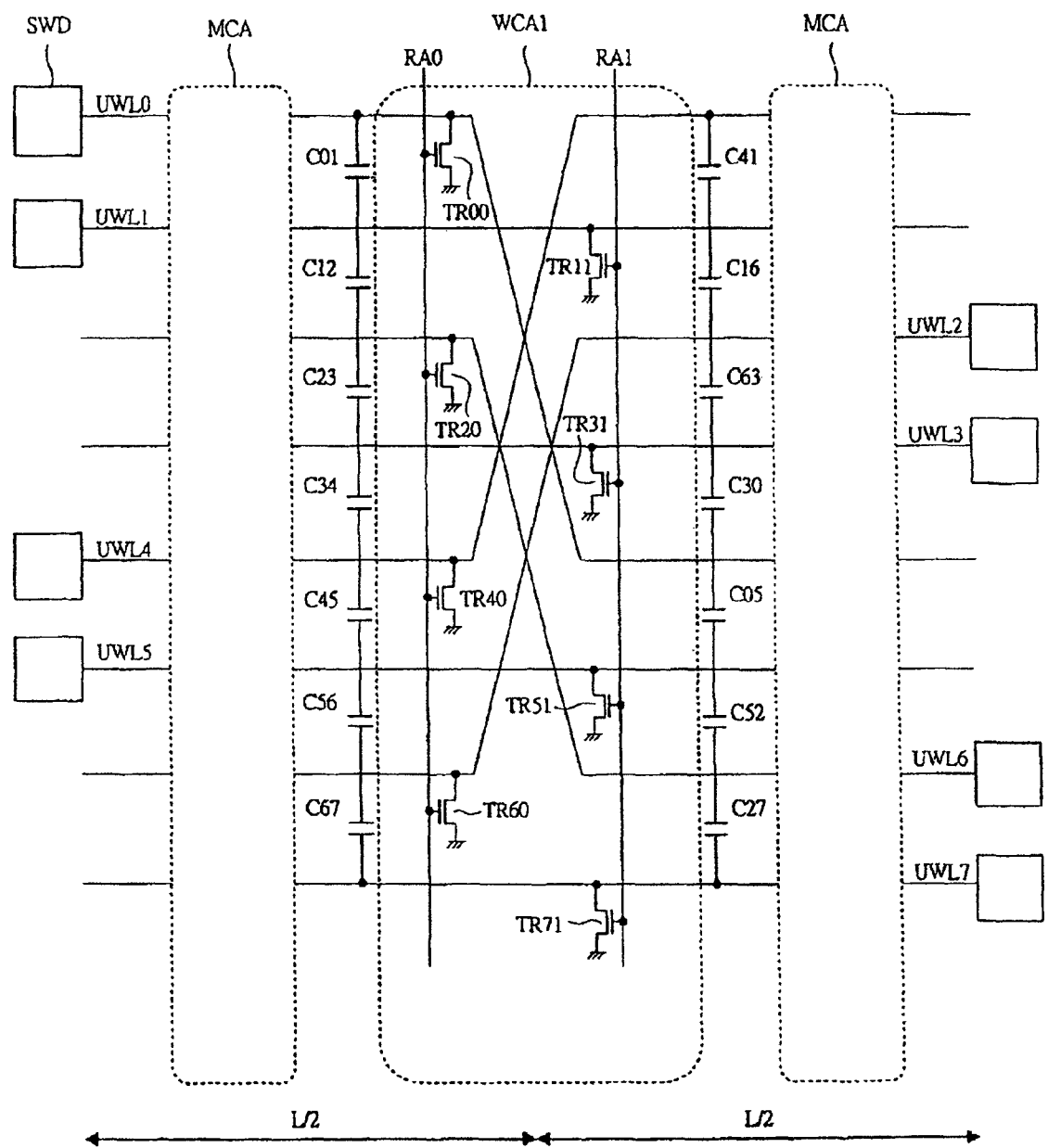
FIG. 16 is a circuit diagram showing the details of an example of the configuration of the memory sub-array in FIG. 6 in the semiconductor memory device according to the third embodiment of the present invention.

FIG. 16 is a circuit diagram showing the details of an example of the configuration of the memory sub-array SARY in FIG. 6 in the semiconductor memory device according to the third embodiment of the present invention.

The example of the configuration shown in FIG. 16 differs from the example of the configuration of the previously described second embodiment with regard to the arrangement of sub-word drivers SWD. Specifically, sub-word drivers are arranged to drive word-lines WL0, WL1, WL4, and WL5 from the left side, and sub-word drivers are arranged to drive word-lines WL2, WL3, WL6, and WL7 from the right side. By adopting this configuration, two adjacent word-lines are connected to a single sub-word driver, and this has the advantage of facilitating formation of layout patterns when lithography is carried out by a Levenson-type (alternating) phase-shift technique.

In the alternating phase-shift technique, phases of "0" and "π" are alternately assigned to adjacent word-lines, and the spacing between "0" values or between "π" values must be made greater than the spacing of the values "0" and "π." When the configuration of FIG. 16 is laid out, "0" and "π" word-lines enter sub-word drivers SWD that are adjacent to each other, and the layout of the connectors of these word-lines and SWD is therefore facilitated.

Fourth Embodiment

Figure 17:
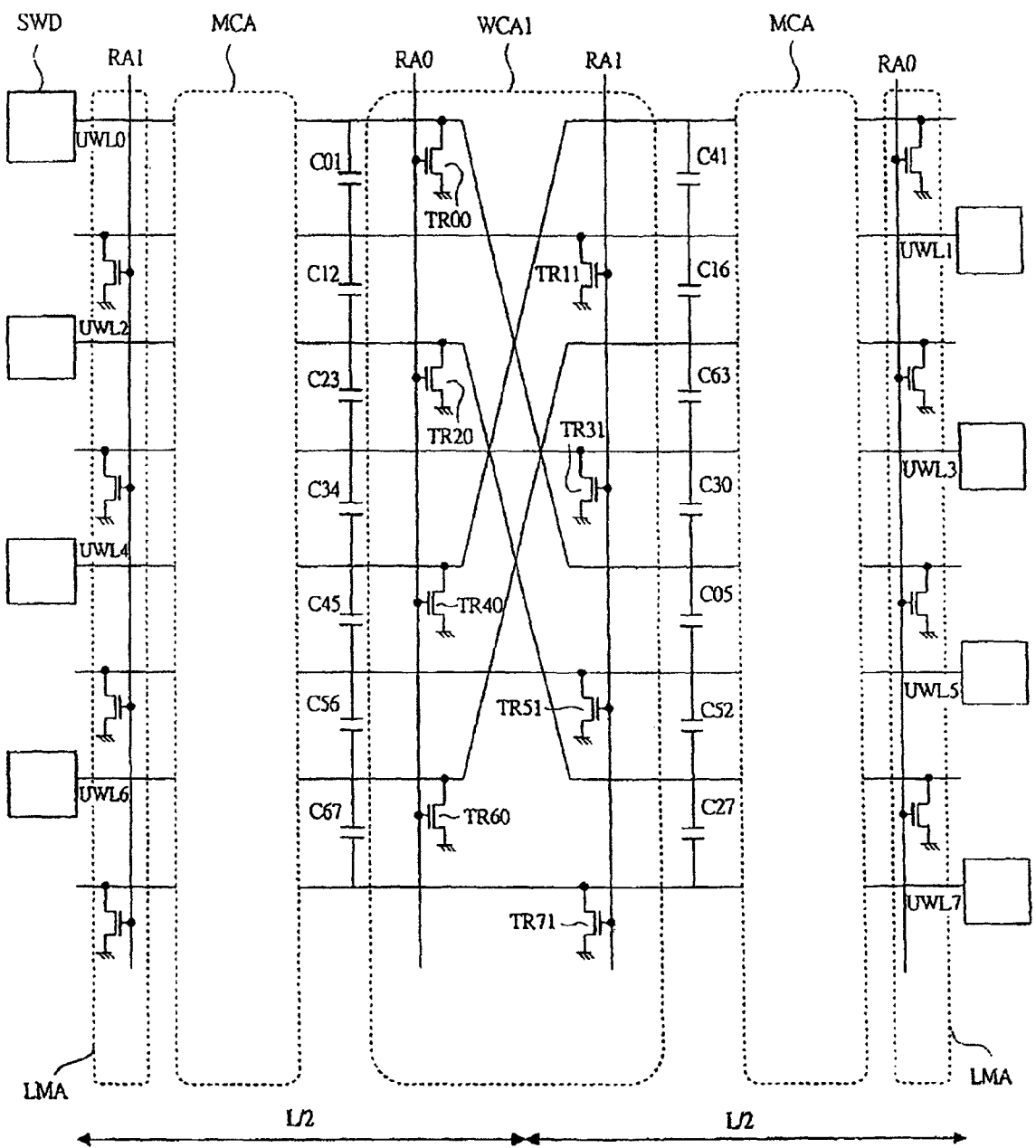
FIG. 17 is a circuit diagram showing the details of an example of the configuration of the memory sub-array in FIG. 6 in the semiconductor memory device according to the fourth embodiment of the present invention.

FIG. 17 is a circuit diagram showing the details of an example of the configuration of memory sub-array SARY in FIG. 6 in the semiconductor memory device according to the fourth embodiment of the present invention. In the configuration of FIG. 17, level-stabilizing circuits are added to areas LMA of the remote portions of upper-level word-lines in the previously described configuration of the second embodiment. In other words, two level-stabilizing circuits are arranged for each word-line. The control signals of level-stabilizing circuits that are arranged in the remote portions of upper-level word-lines are the same as the control signals of the level-stabilizing circuits that connect to the approximate centers of the word-lines. The use of this type of configuration enables a further reduction of the coupling noise that is generated by way of the parasitic capacitance between adjacent word-lines. In addition, the arrangement of level-stabilizing circuits between sub-word drivers SWD and the memory cell area enables a layout in a single row without dividing the memory cell area and therefore allows a layout that is easier or smaller in area.

Although the present invention realized by the present inventors has been described in specific terms based on embodiments, the present invention is not limited to these embodiments and is open to various modifications within a range that does not depart from the gist of the invention.

For example, although memory cells were made up from one MOS transistor and one capacitor in each of the above-described embodiments, the memory cells may also be made up from one MOS transistor and one resistance element, whereby the same effect of reducing coupling noise is obtained. Furthermore, although memory cells and level-stabilizing circuits were made up from vertical MOS transistors, these components may also be realized by planar MOS transistors. In the case of planar MOS transistor as well, advances in miniaturization lead to the problem of coupling noise produced by way of parasitic capacitance between word-lines, but the application of the present embodiment enables a reduction in the coupling noise.

However, when memory cells are made up from vertical MOS transistors, the distance between word-lines is shorter and the parasitic capacitance greater than in planar MOS transistors, in which source or drain areas are arranged between word-lines. As a result, the effect of the present invention is increased by the use of vertical MOS transistors in memory cells. In this case, forming the level-stabilizing circuits by vertical MOS transistors enables a reduction of differences in level in the memory array.

To briefly describe the effects that are obtained by representative elements in the invention disclosed in the present application, a semiconductor memory device can be realized that can reduce the coupling noise that is produced by way of parasitic capacitance between adjacent word-lines while suppressing increase of the chip size.

It is apparent that the present invention is not limited to the above embodiments, but may be modified and changed without departing from the scope and spirit of the invention.

What is claimed is:

1. A semiconductor memory device comprising:
a plurality of word lines;
a plurality of bit lines;
a plurality of memory cells that are provided at intersections of said plurality of word lines and said plurality of bit lines, and each of said memory cells includes a MIS transistor and a memory element;
a decoder circuit for selecting said plurality of word lines; and
a sense-amplifier circuit for determining information that is read from any of said plurality of memory cells to any of said plurality of bit lines;
wherein a twist connector is provided for switching wiring order of said plurality of word lines, and level-stabilizing circuits are arranged in an area below said twist connector, for supplying voltage level of a non-selected state to said plurality of word lines of a non-selected state.

2. The semiconductor memory device according to claim 1, wherein:
four alternately arranged word lines among eight adjacently arranged word lines as a unit, are twisted in said twist connector.

3. The semiconductor memory device according to claim 1, wherein:
said MIS transistor is a vertical MIS transistor;
said memory element is connected to one of a source and a drain of said vertical MIS transistor, that is a top of a semiconductor layer formed in a columnar shape;
any of said plurality of bit lines is connected to the other of said source and said drain that is a bottom of said semiconductor layer; and
any of said plurality of word lines is connected to a gate layer that is formed around a side surface of said semiconductor layer with a gate insulating film interposed.

4. The semiconductor memory device according to claim 1, wherein:
said level-stabilizing circuits are vertical MIS transistors;
any of said plurality of word lines is connected to one of a source and a drain of said vertical MIS transistor, that is a top of a semiconductor layer formed in a columnar shape;
a power-supply line for stabilizing any of said plurality of word lines to a prescribed voltage level is connected to the other of said source and said drain that is a bottom of said semiconductor layer;
a gate layer is formed around a side surface of said semiconductor layer with a gate insulating film interposed; and
said gate layer is driven together with selection or non-selection of said plurality of word lines.

5. The semiconductor memory device according to claim 1, wherein said level-stabilizing circuits are controlled by signals which indicate addresses and are supplied from a chip external terminal.

6. The semiconductor memory device according to claim 1, wherein said plurality of word lines are of a hierarchical construction that includes lower-level word lines connected to said plurality of memory cells and upper-level word lines for shunting said lower-level word lines.

7. The semiconductor memory device according to claim 1, wherein said memory elements are capacitors or resistance elements.

8. The semiconductor memory device according to claim 1, wherein:
said level-stabilizing circuits that are connected to an even-numbered side of said plurality of word lines are arranged in a first area;
said level-stabilizing circuits that are connected to an odd-numbered side of said plurality of word lines are arranged in a second area; and
said first area and said second area are in a two-row form by contiguously arranging a row shape of said first area and a row shape of said second area.

9. The semiconductor memory device according to claim 8, wherein:
said level-stabilizing circuits that are connected to said word lines of said even-numbered side are set in a deactivated state when said word lines of said even-numbered side are selected, and are set in an activated state when said word lines of said odd-numbered side are selected; and
said level-stabilizing circuits connected to said word lines of said odd-numbered side are set in a deactivated state when said word lines of said odd-numbered side are selected, and are set in an activated state when said word lines of said even-numbered side are selected.

10. A semiconductor memory device comprising:
a first area in which are arranged a plurality of first word lines each extending in parallel in a first direction and a plurality of memory cells connected to said plurality of first word lines;
a second area in which are arranged a plurality of second word lines each extending in parallel in said first direction and a plurality of memory cells connected to said plurality of second word lines; and
a twist connection area arranged between said first area and said second area for realizing twist interconnection of said plurality of first word lines and said plurality of second word lines;
wherein said twist connection area includes:
a column-shaped first semiconductor layer;
a first gate layer formed on outer circumference of said first semiconductor layer with a first insulating film interposed;
a first wiring layer extending in a second direction that is orthogonal to said first direction;
a first contact for electrically connecting said first semiconductor layer and any of said plurality of first word lines;
a second contact for electrically connecting said first wiring layer and any of said plurality of second word lines; and
a third contact for electrically connecting said first wiring layer and any of said plurality of second word lines.

11. The semiconductor memory device according to claim 10, wherein:
a first transistor group is provided, comprising electrical connection of each of a plurality of said first gate layers correspond to a plurality of said first semiconductor layer being arranged aligned in said second direction; and
said first transistor group is arranged aligned in two rows in said first direction, said first gate layers included in a first row of said first transistor group being electrically separated from said first gate layers included in a second row of said first transistor group.

12. The semiconductor memory device according to claim 11, wherein:
said plurality of first word lines and said plurality of second word lines are arranged aligned in said second direction in units of eight that are adjacently arranged;
four alternately arranged first word lines among said eight word lines are connected one-to-one in the same wiring layer to four alternately arranged said second word lines among said eight lines;
the remaining four first word lines among said eight word lines are twist-connected one-to-one with the remaining four second word lines among said eight word lines by way of said first wiring layers that each differ;

said four first word lines or second word lines that are connected in said same wiring layer are connected one-to-one by way of said first contacts to four said first semiconductor layers included in said first transistor group of said first row; and said four first word lines or second word lines that are connected by way of said first semiconductor layer are connected one-to-one by way of said first contacts to four said first semiconductor layers included in said first transistor group of said second row.

13. The semiconductor memory device according to claim 10, wherein each of said plurality of memory cells comprises:

a column-shaped second semiconductor layer;

a second gate layer formed on outer circumference of said second semiconductor layer with a second insulating film interposed; and a memory element connected to said second semiconductor layer;

wherein said second gate layer is connected by way of a fourth contact to any of said plurality of first word lines or said plurality of second word lines.

* * * * *

UNITED STATES PATENT AND TRADEMARK OFFICE
CERTIFICATE OF CORRECTION

| | | |
|---|---|---|
| PATENT NO. | : 7,804,700 B2 | Page 1 of 1 |
| APPLICATION NO. | : 12/343086 | |
| DATED | : September 28, 2010 | |
| INVENTOR(S) | : Yasutoshi Yamada et al. | |

It is certified that error appears in the above-identified patent and that said Letters Patent is hereby corrected as shown below:

Column 4, Line 60: Delete "MM" and insert -- MAA --

Column 4, Line 62: Delete "MM" and insert -- MAA --

Signed and Sealed this
Eighth Day of February, 2011

David J. Kappos
*Director of the United States Patent and Trademark Office*